US006697388B1

United States Patent
Broutin et al.

(10) Patent No.: US 6,697,388 B1
(45) Date of Patent: *Feb. 24, 2004

(54) CONTROL SYSTEM FOR USE WITH DBR LASERS

(75) Inventors: Scott L. Broutin, Kutztown, PA (US); James K. Plourde, Allentown, PA (US); John W. Stayt, Schnecksville, PA (US)

(73) Assignee: Agere Systems, Inc., Allentown, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/565,557

(22) Filed: May 5, 2000

(51) Int. Cl.[7] .............................. H01S 3/10; H01S 3/13; H01S 3/04
(52) U.S. Cl. .............................. 372/20; 372/28; 372/32; 372/34
(58) Field of Search ............................... 372/20, 32–34, 372/28

(56) References Cited

U.S. PATENT DOCUMENTS

| | | | | |
|---|---|---|---|---|
| 4,719,636 A | * | 1/1988 | Yamaguchi | ................. 372/20 |
| 5,907,569 A | * | 5/1999 | Glance et al. | ................. 372/38 |
| 6,181,717 B1 | * | 1/2001 | Kner et al. | ................. 372/20 |
| 6,291,813 B1 | * | 9/2001 | Ackerman et al. | ....... 250/214 R |
| 6,359,918 B1 | * | 3/2002 | Bielas | ................. 372/38.01 |
| 6,400,737 B1 | * | 6/2002 | Broutin et al. | ................. 372/20 |

* cited by examiner

Primary Examiner—Paul Ip
Assistant Examiner—James Menefee
(74) Attorney, Agent, or Firm—Dickstein Shapiro Morin & Oshinsky LLP

(57) ABSTRACT

The present invention provides a system and method for dynamically increasing the numeric gain applied to the temperature loop in a DBR laser control system in response to the anticipated wavelength change that occurs as a tuning current ramp is in progress. In accordance with a preferred embodiment of the invention, the feedback control signal to the laser's TEC is overcompensated for, and as a result, the system is forced to respond much faster, thermally, to the anticipated wavelength shift, thus providing improved real time wavelength stabilization to the control system. The implementation of the increased numeric gain can be carried out through software and/or firmware.

44 Claims, 6 Drawing Sheets

CONTROL SYSTEM FOR USE WITH DBR LASERS

BACKGROUND OF THE INVENTION

1. Field of the Invention

The present invention relates to the field of tunable lasers. More specifically, it relates to a system and method for improving wavelength stabilization while also improving mode stabilization of DBR lasers.

2. Description of the Related Art

Optical fiber communications systems provide for low loss and very high information carrying capacity. In practice, the bandwidth of optical fiber may be utilized by transmitting many distinct channels simultaneously using different carrier wavelengths. The associated technology is called wavelength division multiplexing (WDM).

The wavelength bandwidth that any individual channel occupies depends on a number of factors, including the impressed information bandwidth, and margins to accommodate carrier frequency drift, carrier frequency uncertainty, possible inter-channel cross-talk due to non-ideal filters.

To maximize the number of channels, lasers with stable and precise wavelength control are required to provide narrowly spaced, multiple wavelengths. One such laser is the distributed Bragg Reflector (DBR) laser. The DBR laser is a device whose wavelength can be tuned electrically as well as thermally over a range of 8 nm to 22 nm.

Under normal operating conditions of a DBR laser, a thermal electric cooler (TEC) is used to "fine tune" the output wavelength of the laser through a temperature compensating feedback loop. The temperature compensating feedback loop is activated once the current to the tuning section of the laser has been applied to place the laser wavelength close to its desired operating point.

In this situation, the tuning current can be said to be in a "static" or "idle" state, held to a constant value while the temperature compensation feedback loop maintains a stable wavelength via an ever present servo about this desired operating point. Under these conditions, the control system will employ some constant numeric gain in response to this temperature loop control signal which is ideal to maintain wavelength stability with as small a servo as possible about the desired operating point.

However, due to the nature of the DBR laser, a periodic adjustment (up or down) of the current to the tuning section of the laser is required as a means to determine an ideal operating point with respect to mode stabilization of the laser. Such a ramping of the current to the tuning section has the immediate undesirable effect of tending to shift the wavelength of the laser. That is, the tuning current that is optimal for mode stabilization (or some other operating condition such as side mode suppression), may not correspond to the tuning current required to maintain a static wavelength. Therefore, temperature compensation is required to retain the desired wavelength.

Ramping the current to the tuning section with the temperature compensation loop engaged does reduce this tendency to shift in wavelength by thermally adjusting the laser's wavelength via the temperature feedback loop in response to the delta's induced by altering the tuning current. However, depending on the thermal response time of the system, the mitigating effect of the temperature compensation feedback loop (i.e., to reduce the shift in wavelength) is not always ideal. Often, the wavelength has drifted farther than desired during the ramping of the tuning section current because the system cannot adequately respond via temperature compensation in a time frame consistent with the required rate of change of the tuning current ramp.

A principle reason for the above described problem is the fact that the numeric gain applied to the temperature loop, while presumably ideal to minimize the servo about the control point while the tuning current is in a "static" state, is often not responsive enough to ideally compensate for wavelength drift when a tuning current ramp is in progress. Therefore, it is desirable to have a temperature compensation feedback loop in which the numeric gain can be dynamically increased (or suitably altered) as required to improve the responsiveness of the temperature loop when a tuning current ramp is in progress.

SUMMARY OF THE INVENTION

The present invention provides a system and method for dynamically increasing the numeric gain applied to the temperature loop in a DBR laser control system in response to the anticipated wavelength change that occurs as a tuning current ramp is in progress. In accordance with a preferred embodiment of the invention, the feedback control signal to the laser's TEC is overcompensated for, and as a result, the system is forced to respond much faster, thermally, to the anticipated wavelength shift, thus providing improved real time wavelength stabilization by the control system. The implementation of the increased numeric gain can be carried out through software and/or firmware.

BRIEF DESCRIPTION OF THE DRAWINGS

These and other features and advantages of the invention will become more readily apparent from the following detailed description which is provided in connection with the accompanying drawings in which.

DETAILED DESCRIPTION OF PREFERRED EMBODIMENT

A preferred embodiment and application of the invention will now be described with reference to FIGS. 1–6. Other embodiments may be realized and structural or logical changes may be made to the disclosed embodiment without departing from the spirit or scope of the invention.

Figure 1:
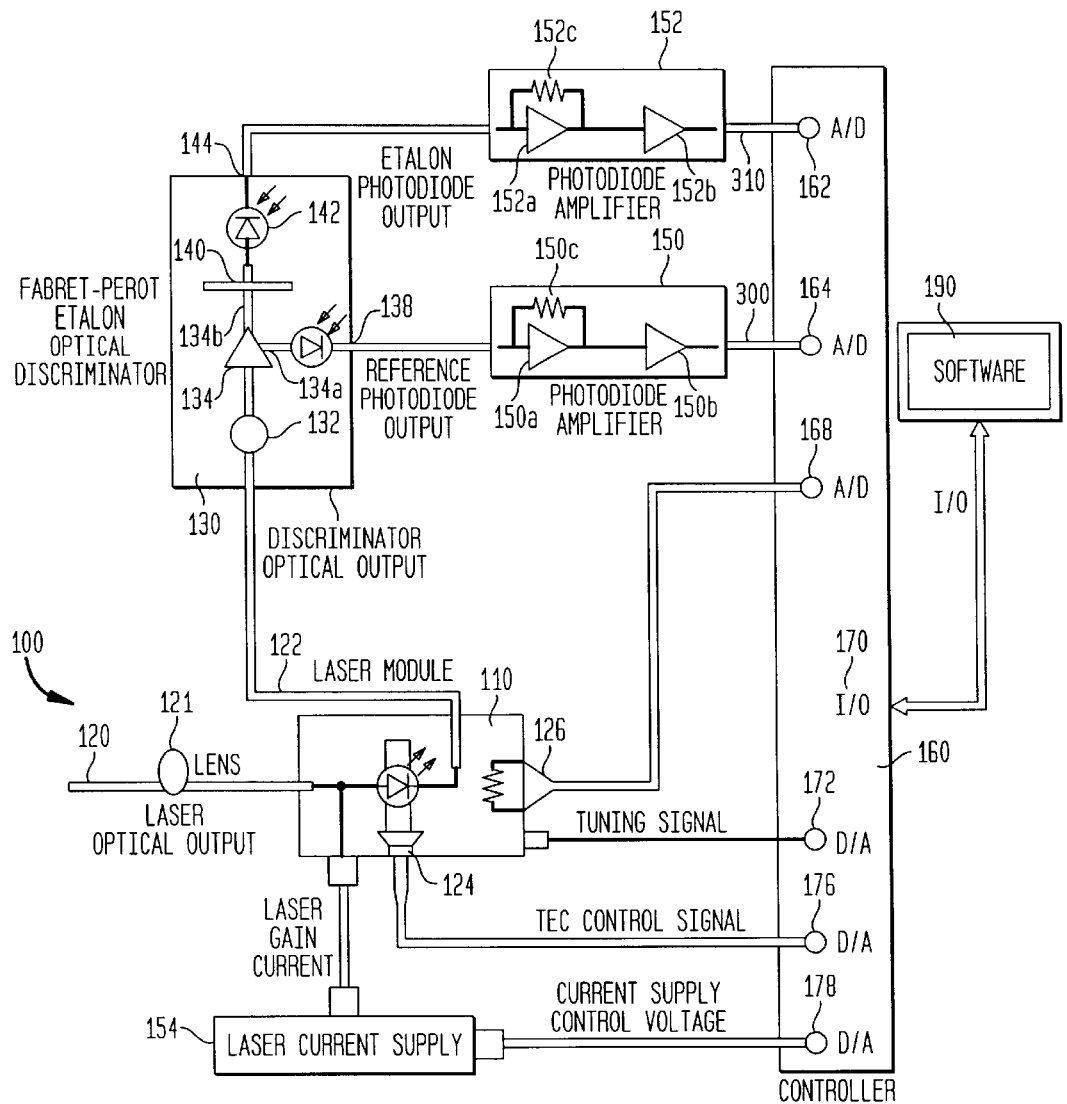
FIG. 1 illustrates a DBR laser control system in accordance with an embodiment of the present invention.

FIG. 1 illustrates a DBR laser control system in accordance with an embodiment of the present invention. A laser module 110 is mounted on a thermoelectric cooler (TEC) 124. As known in the art for temperature tuned lasers, the output of laser module 110 can be adjusted by modifying its temperature. The temperature of laser module 110 can be adjusted by varying the temperature of TEC 124. A thermistor 126 is used to monitor the temperature of the module 110. The temperature of TEC 124 is varied based on a TEC control signal from a controller 160 through a digital to analog (D/A) controller output 176.

Controller 160 may include a programmable logic device, one example being a microprocessor. If a microprocessor is used, it may be any conventional general purpose single or multi-chip microprocessor, or may be any conventional special purpose microprocessor such as a digital signal processor. It should be appreciated that D/A and A/D converters external to the controller 160 can be used to convert any output or input of the controller 160 and the invention is not to be limited to a controller 160 having internal D/A and A/D conversion capabilities.

Controller 160 monitors and controls the output of the laser module 110 as will be discussed below. The module 110 generates a laser output 120 and a backface output 122. A lens 121 may be provided to focus the laser output 120. The laser output 120 is transmitted over an optical link, such as a fiber optic cable (not shown).

The backface output 122 is used as an input to a Fabret-Perot etalon optical discriminator circuit 130. The Discriminator 130 contains a lens 132, an optical splitter 134, two photodiodes 136, 142 and an etalon filter 140. The etalon filter 140 may be replaced by any optical element whose output is a function of wavelength. The backface output 122 is provided to the splitter 134 and split into two separate discriminator signals 134a, 134b. The first discriminator signal 134a, is input to the first photodetector 136 to convert the signal 134a (which is an optical signal) into an electrical signal 138 (hereinafter referred to as the "reference photodiode output 138"). The reference photodiode output 138 is input to a first photodiode amplifier circuit 150, which may include for example, operational amplifiers 150a, 150b and feedback resistor 150c, to form a reference signal 300. The reference signal 300 is input into controller 160 via an analog to digital (A/D) input 164. The first photodiode 136, reference photodiode output 138, reference signal 300 and the first amplifier circuit 150 form a conventional "reference path" used by the controller during wavelength stabilization and channel selection.

The second discriminator signal 134b is input to the etalon filter 140. The output from the etalon filter 140 is input to the second photodetector 142 to convert the signal 134b (which is an optical signal) into an electrical signal 144 (hereinafter referred to as the "etalon photodiode output 144"). The etalon photodiode output 144 is input into a second photodiode amplifier circuit 152, which may include for example operational amplifiers 152a, 152b and feedback resistor 152c, to form an etalon signal 310. The etalon signal 310 is input into controller 160 via an analog to digital (A/D) input 162. The etalon filter 140, second photodiode 142, etalon photodiode output 144, etalon signal 310 and the second amplifier circuit 152 form a conventional "etalon path" used by the controller in conjunction with the reference path during wavelength stabilization and channel selection. The etalon path in conjunction with the reference path form what is commonly known as a wavelength stabilization system. Multiple etalon paths may be employed to complete the control system.

The controller 160 supplies a tuning signal to the module 110 via a D/A output 172. This tuning signal is used to control a tuning mirror section within the laser module 110, as is known in the art, so that it selects the desired wavelength. The controller via D/A output 178 supplies a current supply control voltage to a laser current supply 154, which uses this voltage to supply a laser gain current to the module 110. As will be discussed below, the control system anticipates when a tuning current ramp is required to optimize the system performance, and therefore, a control signal having an increased closed loop gain is sent to the TEC 124, via D/A 176.

The controller 160 is capable of loading therein a computer software program 190 via an input/output (I/O) terminal 170. The I/O terminal 170 can be a serial port, universal bus or any other terminal or interface capable of inputting the instructions and data portions of a computer software program including an Ethernet or other network port. The controller 160 contains non-volatile and volatile memory (not shown) required to store and run the input software program 190. It is desirable that non-volatile memory be used to store the program 190 and any data required by the program so that the system 100 can operate in a stand alone mode. It is also desirable that the controller 160 contain volatile memory to be used as temporary storage while the program 190 is executing. It should be appreciated that the exact architecture of the controller 160 is not important as long as the controller 160 can execute the method 200 of the present invention (FIG. 2).

Figure 2:
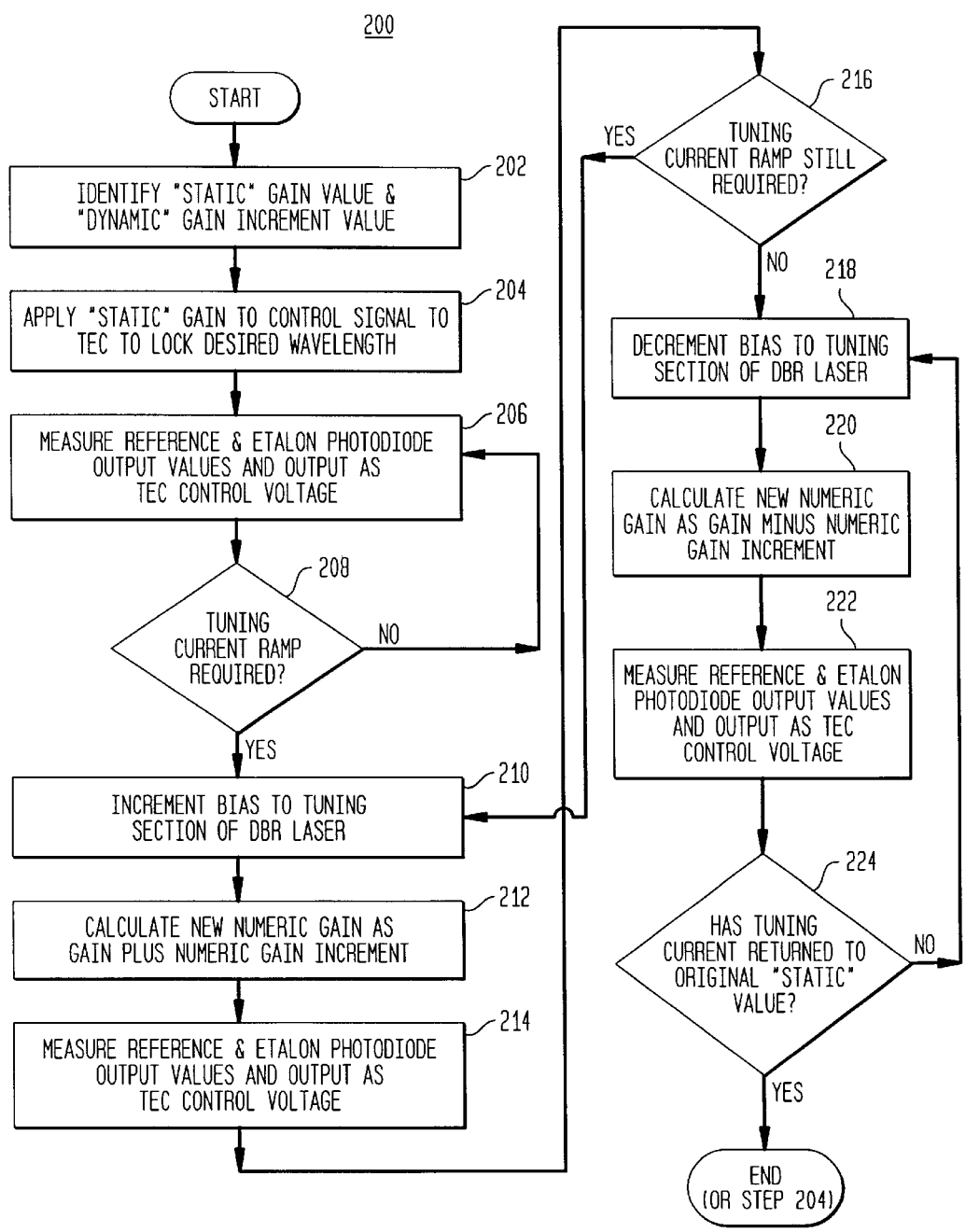
FIG. 2 illustrates in flowchart form an exemplary method of controlling the FIG. 1 control system.

Turning to FIG. 2, an exemplary method 200 of controlling the FIG. 1 control system is depicted in flowchart form, in accordance with an embodiment of the invention.

At step 202, the controller 160 identifies a "static" gain level and a "dynamic" gain increment value. These gain values will be determined at the manufacturing facility and available to a user on a look-up table. At step 204, the controller 160 applies a "static" gain level to the control signal to be delivered to the TEC 124 in order to lock the laser 110 onto a desired wavelength value.

At step 206, the values of the reference photodiode output signal 138 and the etalon photodiode output signal 144 are determined and sent to controller 160. The controller 160 then sends a corresponding control voltage to the TEC 124. A determination is then made, at step 208, as to whether a tuning current ramp is required. If not, the controller repeats step 206. If yes, then the controller 160 increments the bias to the tuning section of laser 110 at step 210.

Having performed the required tuning current ramp at step 210, the controller 160, at step 212, calculates a new numeric gain as being the old gain (e.g., the "static" gain) plus the "dynamic" gain increment value. At step 214, the values of the reference photodiode output signal 138 and the etalon photodiode output signal 144 are determined and sent to controller 160. The controller 160 then sends a corresponding control voltage to the TEC 124.

At step 216, a determination is made whether a tuning current ramp is still required. If yes, then steps 210–216 are repeated. If not, then the controller 160 decrements the bias to the tuning section of laser 110 at step 218.

At step 220, the controller 160 calculates the new numeric gain as the old gain minus the "dynamic" gain increment value. At step 222, the values of the reference photodiode output signal 138 and etalon photodiode output signal 144 are determined and sent to controller 160. The controller 160 then sends a corresponding control voltage to the TEC 124. At step 224, a determination is made whether the tuning current level has returned to its original "static" value. If not, then steps 218–224 are repeated.

Figure 3:
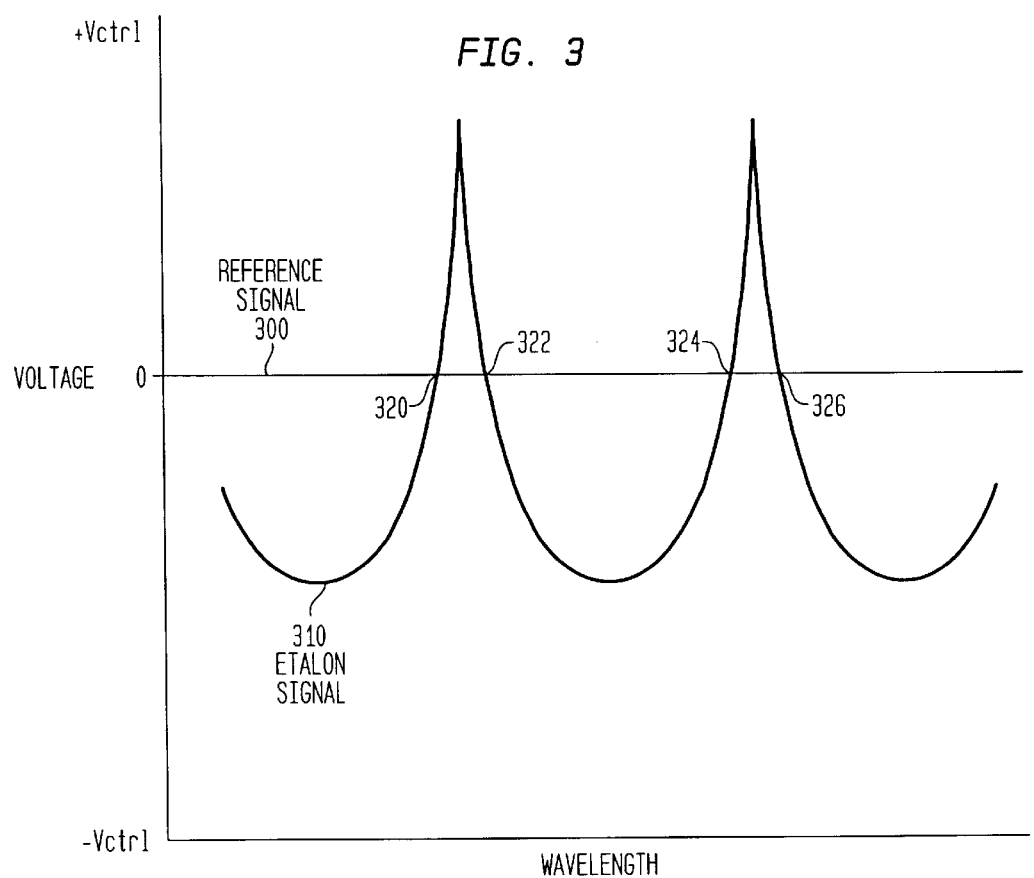
FIG. 3 illustrates exemplary reference and etalon signals used in an embodiment of the present invention.

FIG. 3 illustrates exemplary reference and etalon signals 300, 310 used during this process. Determining if the laser module is tuned to the correct channel and transmitting safely within its specified wavelength requires tracking the etalon transitions 320, 322, 324, 326 of the etalon signal 310 using the reference signal 300 as a reference point for the transitions. As noted earlier, the reference signal 300 is obtained from the reference path portion of the system 100 and the etalon signal 310 is obtained from the etalon path portion of the system 100.

As known in the art, the etalon signal 310 will cross the reference signal 300 at specified points as the wavelength changes. These crossing points are known in the art as etalon transitions. Exemplary etalon transitions are designated by reference numerals 320, 322, 324 and 326. As also known in the art, these transitions 320, 322, 324, 326 may correspond to a channel. For example, transition 322 corresponds to the current channel and transition 324 corresponds to another channel.

The method described above in connection with FIG. 2 monitors the etalon signal 310 to determine when the wavelength has veered too far away (i.e., a predetermined value) from the specified wavelength. In addition, the method 200 is capable of distinguishing between transitions that correspond to channels and those that do not. Any conventional technique for tracking the etalon signal 310 and the etalon transitions 320, 322, 324, 326 can be used.

In accordance with an embodiment of the invention, and as described above in connection with FIG. 2, since the controller is constantly receiving signals from lines 300 and 310, the controller 160 is able to anticipate when the laser module 110 must be temperature tuned away from the specified wavelength, as is the situation imposed by a tuning current ramp.

When the controller 160 anticipates the requirement for a tuning current ramp, it proactively begins to send a TEC control signal to TEC 124 to counter the effect of the increased tuning current (i.e., an undesirable shift in wavelength).

Figure 4:
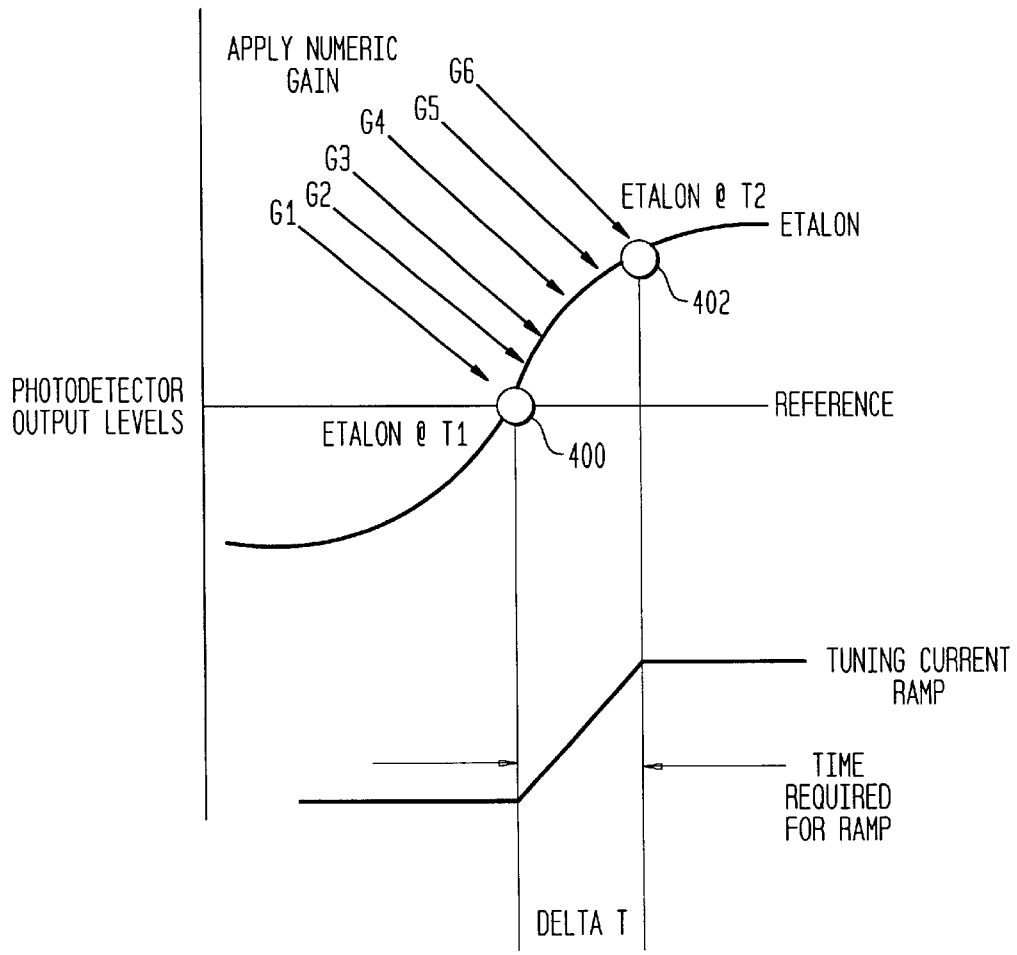
FIG. 4 illustrates exemplary etalon levels as tuning current is ramped in accordance with an embodiment of the present invention.

Turning to FIG. 4, exemplary etalon levels are depicted as the tuning current is ramped in accordance with an embodiment of the present invention. Intersection point 400 shows an exemplary desired operating point for the etalon output, which will correlate to a desired laser wavelength (310 of FIG. 1) during a "static" state in which a constant closed loop gain G1 would be applied if no tuning current ramp is applied in the FIG. 1 control system.

However, when a tuning current ramp is applied to sense changes in the operating point that is required, for example, to avoid mode hopping, during the time-frame, delta T, the etalon output level 310 increases resulting in an undesirable shift of the wavelength. In accordance with an embodiment of the invention, as the tuning current ramp occurs, the closed loop gain (e.g., G1–G6) applied to the TEC control signal of FIG. 1 is incrementally increased from the original G1 to some higher level of closed loop gain (i.e., G1, G2, G3, . . . etc.).

The number of gain levels is not as important as the fact that the closed loop gain is incrementally increased to counter the effects of the tuning current ramp. That is, as the closed loop gain of the TEC control signal is increased, the current to the TEC (124 of FIG. 1) is also increased, resulting in a faster temperature reaction to the increasing tuning current. By increasing numeric gain in this manner, an exponential relationship is introduced to the thermal response time which drives the system harder toward the desired laser temperature at a rate that, in accordance with a preferred embodiment of the invention, is matched to the rate at which the tuning current is altered.

Figure 5:
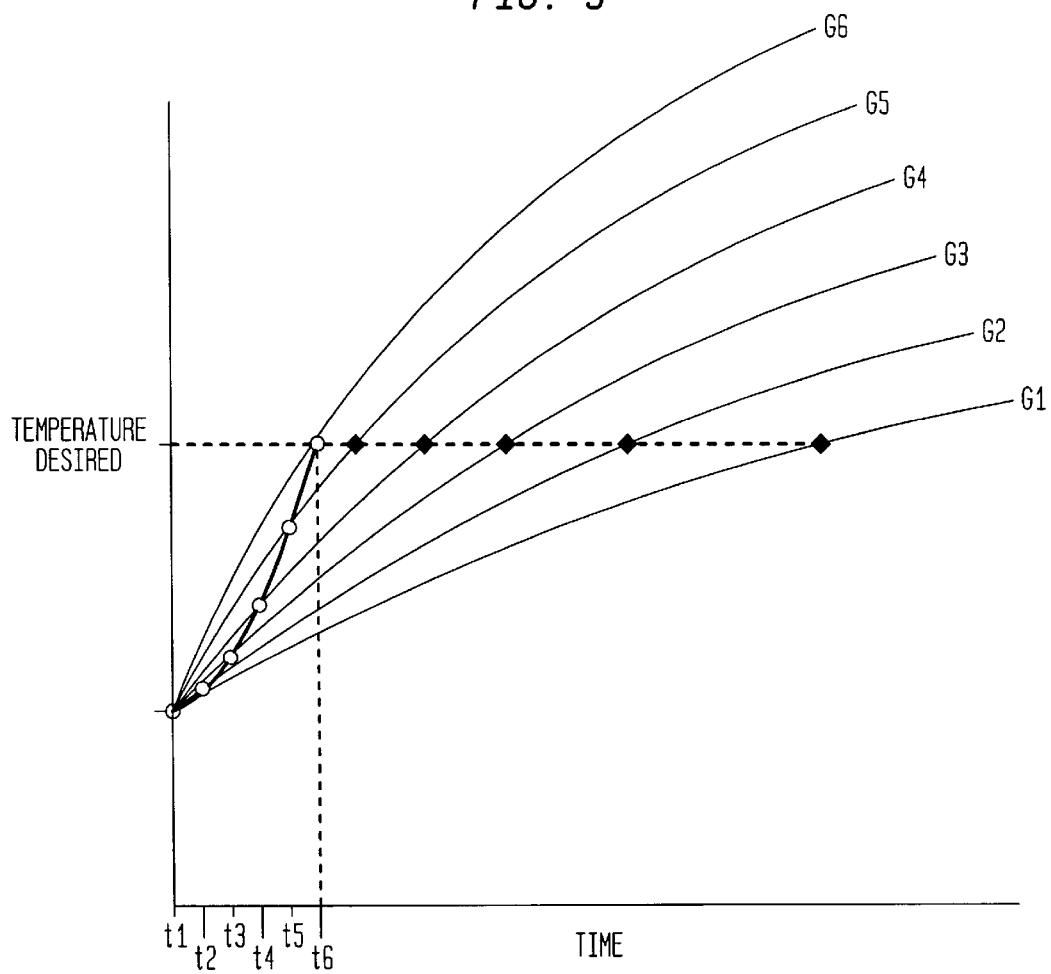
FIG. 5 illustrates an exemplary graphical representation of time required to reach a desired temperature in accordance with an embodiment of the present invention.

Turning now to FIG. 5, an exemplary graphical representation of time required to reach a desired temperature in accordance with an embodiment of the present invention is depicted. The graph depicts a dynamic system with an ever increasing numeric gain being applied to the temperature feedback loop as the tuning current is ramped. As depicted, the thermal response of the system will react exponentially and stability of the wavelength is recovered in a similar manner. In accordance with an embodiment of the invention, the changes in numeric gain are then reduced in a similar, but reciprocal, manner as the system recovers and the tuning current is brought back to a "static" state.

Figure 6:
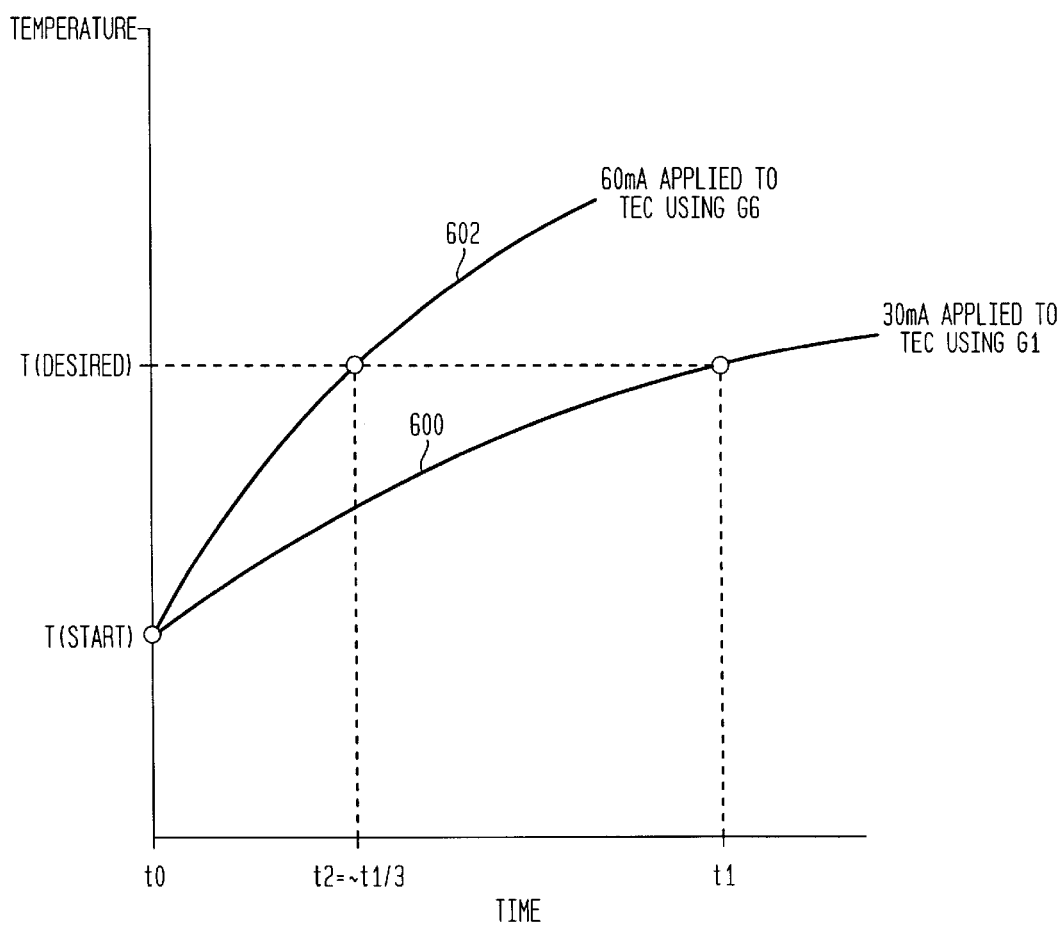
FIG. 6 illustrates an exemplary graphical representation of time required to reach a desired temperature in accordance with an embodiment of the invention.

FIG. 6 illustrates an exemplary graphical representation of the time required to reach a desired temperature for two different numeric gain values, in accordance with an embodiment of the invention. Normally, by using gain G1 in response to the depicted changing etalon readings (i.e., changing in response to the tuning current ramp), the FIG. 1 system reacts as indicated by etalon reading 600, with. the laser 110 wavelength recovering at t1.

In contrast, in accordance with a preferred embodiment of the invention, the tuning current ramp is anticipated and the numeric gain (e g., G1–G6) applied to the temperature control loop of the FIG., 1 system is incrementally increased. This results in overcompensation for the shift in wavelength due to the tuning current ramp. Etalon value 602 of FIG. 6 depicts an exemplary system response when numeric gain G6 (where G6>>G1) is applied to the temperature control loop of FIG. 1. As depicted, the recovery time can be reduced to approximately one-third that of the recovery time with gain G1.

The present invention provides an improved DBR laser wavelength stabilization control system that anticipates the periodic ramping of the tuning current. In response to anticipating the tuning current ramp, and consequential wavelength shift, the control system, in accordance with an embodiment of the invention, compensates by periodically increasing the numeric gain of the temperature control loop such that temperature at the TEC is proactively adjusted to modify the laser 110 temperature, and maintain the desired output wavelength.

While a preferred embodiment of the invention has been described and illustrated, it should be readily apparent that many modifications can be made to the invention without departing from its spirit or scope. For example, although a controller 160 is depicted as controlling, via software 190, the control method 200 of the invention as described in the FIG. 2 flowchart, it should be readily apparent that any device or component capable of performing the control method 200 may be substituted. In addition, although the invention is described as being used with a DBR laser, the invention may be used with any control system having problems similar to those described in the prior art. Accordingly, the invention is not limited by the foregoing description or drawings, but is only limited by the scope of the appended claims.

What is claimed as new and desired to be protected by Letters Patent of the United States is:

1. A method of controlling a laser, comprising:
   determining a tuning current ramp level of said laser; and
   changing the tuning current ramp level of said laser with a rate that changes with respect to time such that a gain used to affect a rate of temperature level adjustment in a temperature based laser wavelength stability system for said laser is dynamically determined and a temperature level of said laser rapidly compensates a wavelength of said laser such that the wavelength is substantially unchanged, wherein wavelength of said laser is tunable by varying at least one refractive property of said laser.

2. The method of claim 1, wherein said act of changing a tuning current ramp level comprises incrementing a bias to a tuning section of said laser.

3. The method of claim 1, wherein said act of changing a tuning current ramp level comprises decrementing a bias to a tuning section of said laser.

4. The method of claim 1, wherein said act of changing the tuning current ramp level of said laser with a rate comprises sending a control signal to a temperature controller, said temperature controller being thermally coupled with said laser.

5. The method of claim 4, wherein said act of sending comprises determining a numeric gain value applied to said control signal.

6. The method of claim 5 further comprising determining whether said laser requires a tuning current ramp level change.

7. The method of claim 6 further comprising:
determining said laser requires a tuning current increase; and
incrementing a bias to a tuning section of said laser to increase said tuning current.

8. The method of claim 7, wherein said act of determining comprises adding a numeric gain increment to said numeric gain value.

9. The method of claim 6 further comprising decrementing a bias to a tuning section of said laser.

10. The method of claim 9 further comprising:
determining said laser is at a minimum value of tuning current level; and
incrementing a bias to a tuning section of said laser.

11. The method of claim 6 further comprising:
determining said laser is at maximum value of tuning current level; and
incrementing a bias to a tuning section of said laser.

12. The method of claim 11, wherein said act of determining comprises subtracting a numeric gain increment from said numeric gain value.

13. The method of claim 12 further comprising determining said tuning current level has reached a "static" value.

14. The method of claim 5 further comprising:
measuring a reference value of said wavelength;
measuring an etalon value; and
sending a control voltage level to a temperature controller, said temperature controller being thermally coupled with said laser.

15. The method of claim 1, wherein said act of changing a tuning current ramp level of said laser with a rate comprises increasing a numeric gain value applied to said tuning current.

16. The method of claim 15, wherein said act of increasing a numeric gain comprises periodically increasing a numeric gain value by discrete gain level increments until a maximum desired gain value is reached.

17. A method of claim 1, wherein said laser is mode stabilized.

18. A method as in claim 1, wherein said temperature based laser wavelength stability system comprises a thermoelectric cooler.

19. A method of controlling a laser comprising:
identifying a "static" gain value and a "dynamic" gain increment value;
applying said "static" gain value to a control signal to a thermo-electric cooler for locking a desired wavelength;
measuring a reference photodiode output and an etalon photodiode output and producing a corresponding termo-electric cooler control voltage;
determining whether a tuning current ramp is required;
incrementing a bias to a tuning section of said laser;
calculating a new numeric gain as gain plus "dynamic" gain increment value;
measuring the reference photodiode output and the etalon photodiode output and producing a corresponding thermo-electric cooler control voltage with said new numeric gain; and
determining whether a tuning current ramp is still required.

20. The method of claim 19 further comprising incrementing a bias to said tuning section of said laser when it is determined that a tuning current ramp is still required.

21. The method of claim 19 further comprising:
decrementing a bias to said tuning section of said laser when it is determined that a tuning current ramp is not still required;
calculating a new numeric gain as gain minus "dynamic" gain increment value;
measuring the reference photodiode output and the etalon photodiode output and producing a corresponding thermo-electric cooler control voltage; and
determining whether the tuning current value has returned to a "static" level.

22. A system for controlling a laser, comprising:
a laser current delivery portion coupled to said laser for delivering a tuning current ramp to said laser;
a temperature controlling portion thermally coupled to said laser for controlling a temperature level of said laser; and
a controller coupled to said laser and temperature controlling portion, said controller being configured to change the tuning current ramp level of said laser with a dynamic rate of change that varies with respect to time such that a gain used to affect a rate of temperature level adjustment in a temperature based laser wavelength stability system for said laser is dynamically determined and a temperature level of said laser compensates a wavelength of said laser such that the wavelength is substantially unchanged.

23. The system of claim 22 further comprising a wavelength detecting portion coupled to said laser for detecting said wavelength.

24. The system of claim 23, wherein said wavelength detecting portion comprises:
an etalon photodiode coupled to said controller; and
a reference photodiode coupled to said controller.

25. The system of claim 22, wherein said laser current delivery portion comprises a laser current supply.

26. The system of claim 25, wherein said controller is a programmable logic device.

27. The system of claim 22, wherein said temperature controlling portion comprises:
a thermo-electric cooler for increasing or decreasing said temperature level; and
a thermistor for measuring said temperature level.

28. The system of claim 27, wherein said wavelength detecting portion comprises:

a plurality of etalon photodiodes coupled to said controller; and a reference photodiode coupled to said controller.

29. The system of claim 27, wherein said controller is coupled to said wavelength controlling portion for receiving said detected wavelength.

30. The system of claim 29, wherein said controller is coupled to a thermo-electric cooler current delivery portion for changing said thermo-electric cooler current level based upon said detected wavelength.

31. The system of claim 30, wherein said controller is configured to determine said laser requires a tuning current increase and also configured to increment a bias to a tuning current section of said laser.

32. The system of claim 30, wherein said controller is configured to determine said laser requires a tuning current decrease and also configured to decrement a bias to a tuning current portion of said laser.

33. A system for controlling a laser as in claim 22, wherein said temperature based laser wavelength stability system comprises a thermoelectric cooler.

34. A method of controlling a laser system, comprising:

determining if at least one of a plurality of tuning current ramps of a laser must be changed; and changing at least one of said plurality of tuning current ramps of said laser, wherein at least one of said plurality of tuning current ramps are changed based upon a dynamic rate that varies with respect to time such that a gain used to affect a rate of temperature level adjustment in a temperature based laser wavelength stability system for said laser is dynamically determined and a temperature level of said laser compensates a wavelength of said laser such that the wavelength is substantially unchanged.

35. A method as in claim 34, wherein a different dynamic rate is used for each of said plurality of tuning current ramps changed based upon a dynamic rate.

36. A method as in claim 34, wherein said act of changing at least one of said plurality of tuning current ramps comprises incrementing a bias to a wavelength tuning section of said laser system.

37. A method as in claim 34, wherein said plurality of tuning current ramps comprises a wavelength tuning current for adjusting at least one refractive property of said laser.

38. A method as in claim 34, wherein said plurality of tuning currents current ramps comprises a laser gain current and a tuning section current coupled to an optical field within said laser cavity.

39. A method as in claim 34, wherein said act of changing at least one of said plurality of tuning current ramps of said laser based upon a dynamic rate comprises increasing a numeric gain value applied to said tuning current.

40. A method of controlling a laser as in claim 34, wherein said temperature based laser wavelength stability system comprises a thermoelectric cooler.

41. A system for controlling a laser comprising:

a laser;

a temperature sensor portion for sensing temperature of said laser;

a wavelength detector portion for sensing wavelength of said laser;

at least one controller portion for outputting a plurality of tuning current ramp signals for said laser comprising a first, second and third tuning current ramp signal, wherein said controller portion determines rate changes for said first, second and third tuning current ramp signals based upon a plurality of inputs comprising at least one temperature signal from said temperature sensor and at least one wavelength signal from said wavelength detector portion.

42. A system as in claim 41 further comprising a plurality of laser tuning portions, least some of said plurality of laser tuning portions respectively tuned by said tuning current ramp signals.

43. A system as in claim 42, wherein said plurality of laser tuning portions comprises a laser wavelength tuning portion for altering at least one refractive property of said laser.

44. A system as in claim 42, wherein said plurality of laser tuning portions comprises a laser gain tuning portion.

* * * * *